United States Patent
Sato et al.

(10) Patent No.: US 12,276,908 B2
(45) Date of Patent: Apr. 15, 2025

(54) IMPRINT METHOD AND ARTICLE MANUFACTURING METHOD

(71) Applicant: CANON KABUSHIKI KAISHA, Tokyo (JP)

(72) Inventors: Hiroshi Sato, Tochigi (JP); Tetsuji Okada, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 242 days.

(21) Appl. No.: 18/058,883

(22) Filed: Nov. 28, 2022

(65) Prior Publication Data

US 2023/0176476 A1    Jun. 8, 2023

(30) Foreign Application Priority Data

Dec. 8, 2021   (JP) .................................. 2021-199455

(51) Int. Cl.
   *G03F 7/00* (2006.01)

(52) U.S. Cl.
   CPC .................... *G03F 7/0002* (2013.01)

(58) Field of Classification Search
   None
   See application file for complete search history.

(56) References Cited

U.S. PATENT DOCUMENTS

| 2013/0037981 A1 | 2/2013 | Tanaka et al. |
| 2017/0184958 A1* | 6/2017 | Kawamura ........... G03F 7/0002 |
| 2017/0365470 A1 | 12/2017 | Nishimura et al. |

FOREIGN PATENT DOCUMENTS

| JP | 2013055327 A | 3/2013 |
| JP | 2017010962 A | 1/2017 |
| JP | 2018182303 A | 11/2018 |

* cited by examiner

*Primary Examiner* — Robert J Grun
(74) *Attorney, Agent, or Firm* — ROSSI, KIMMS & McDOWELL LLP

(57) ABSTRACT

An imprint method of performing an imprint process for a shot region of a substrate using a mold is provided. The substrate includes a valid region where a chip is to be formed, and an invalid region outside the valid region where no chip is to be formed, and the invalid region is a region formed by etching an outer region outside the valid region. The method includes deciding, based on a height difference between the valid region and the invalid region, an imprint condition for a partial shot region defined by an outer edge of the valid region, and performing the imprint process for the partial shot region in accordance with the decided imprint condition.

5 Claims, 18 Drawing Sheets

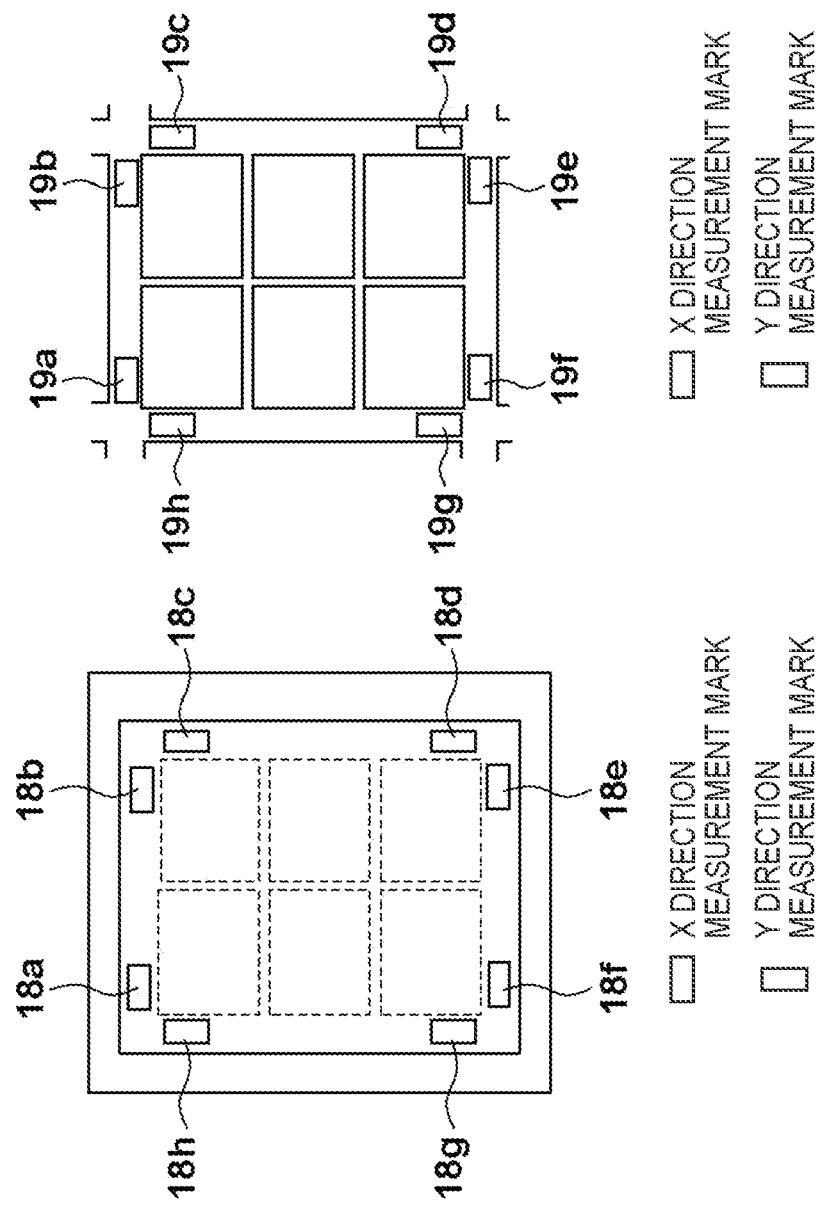

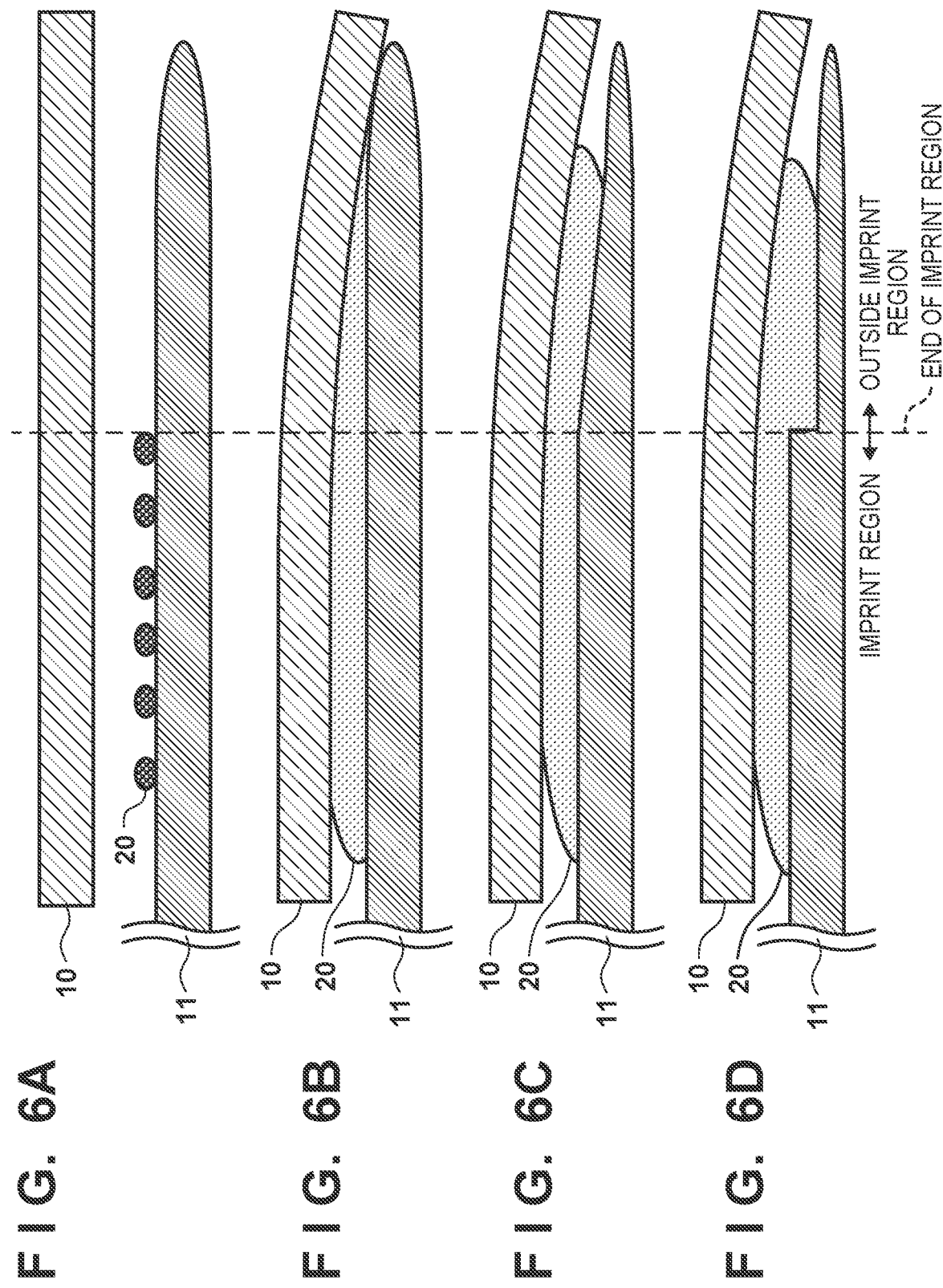

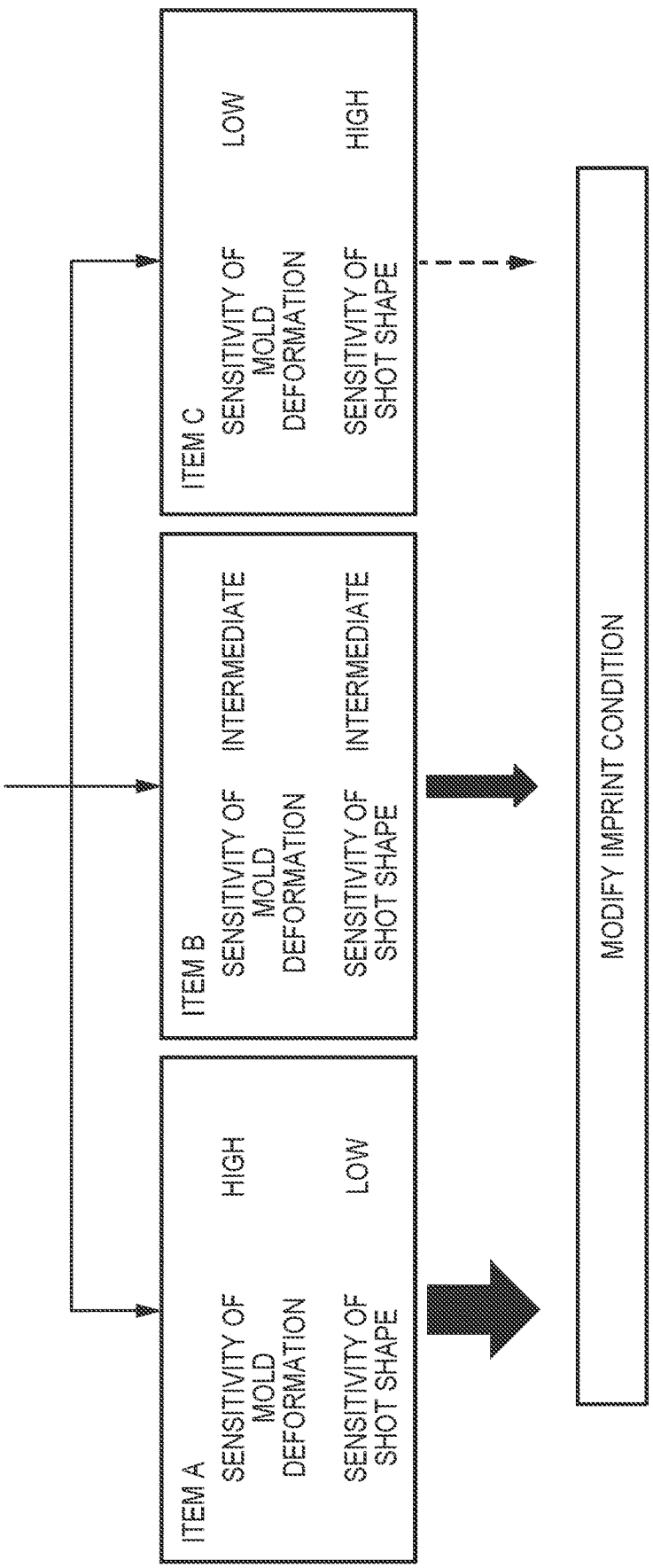

F I G. 12A
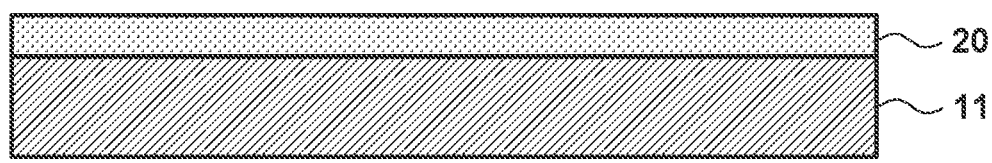
F I G. 12B
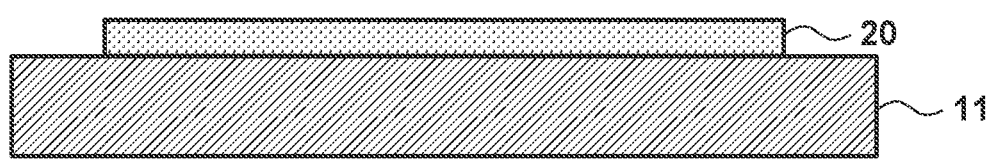
F I G. 12C
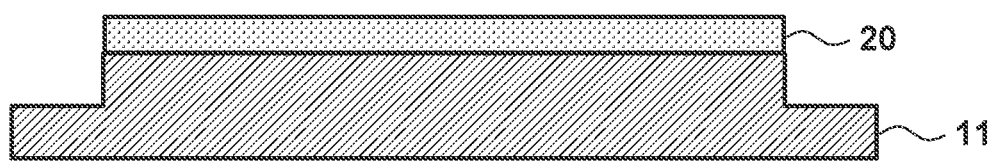
F I G. 12D
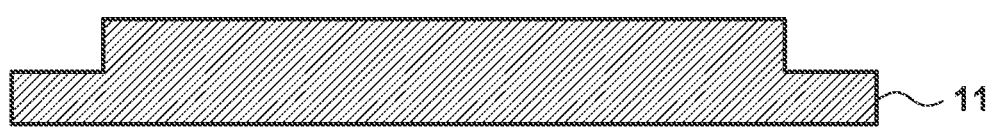

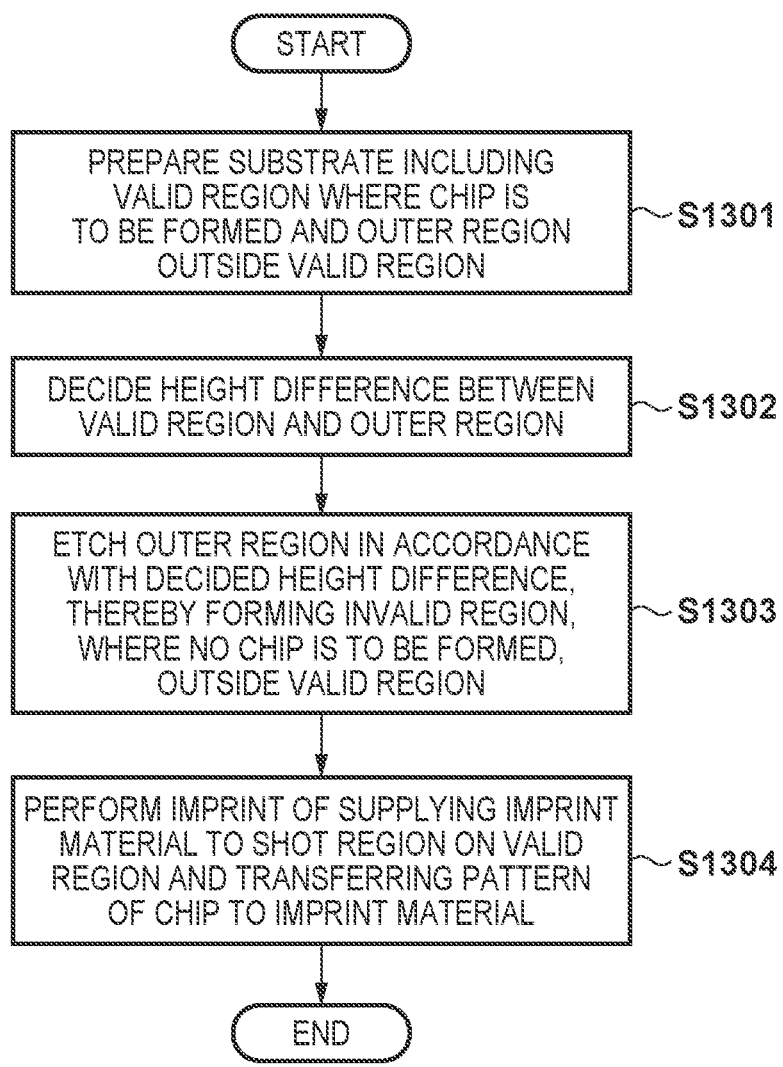

IMPRINT METHOD AND ARTICLE MANUFACTURING METHOD

BACKGROUND OF THE INVENTION

Field of the Invention

The present invention relates to an imprint method and an article manufacturing method.

Description of the Related Art

An imprint apparatus is one of lithography apparatuses used in the lithography step of manufacturing an article such as a semiconductor device. The imprint apparatus forms a pattern of an imprint material on a substrate by curing the imprint material in a state in which a mold is in contact with the imprint material on the substrate such as a silicon wafer or a glass plate, and separating the mold from the cured imprint material.

In general, a plurality of shot regions are arrayed in a matrix on the substrate. The entire pattern portion of the mold is transferred to a normal shot region. However, in the vicinity of the outer periphery portion of the substrate, there can be a shot region (partial shot region) to which only a part of the pattern of the mold is transferred because the mold protrudes from the substrate in the imprint process. In order to maximize the valid area (the areas of the regions in each of which the pattern is formed) of the substrate, such partial shot regions should also be used.

However, in the partial shot region, problems such as the influence of the nonuniform arrangement of the imprint material and/or the difficulty in guaranteeing the absence of a foreign substance can become signification. In order to reduce the problems as described above, it has been proposed to form a taper or step in a substrate end portion (see Japanese Patent Laid-Open Nos. 2017-010962 and 2018-182303).

In the partial shot region, a part of the mold may come into direct contact with the substrate upon bringing the pattern portion of the mold into contact with the imprint material on the substrate, and the thickness unevenness of the imprint material may increase. Accordingly, there are concerns that a large shear force is generated during driving for relative alignment between the mold and the substrate, making it difficult to drive them, and that part of the imprint material remains on the mold when the mold is separated from the imprint material.

SUMMARY OF THE INVENTION

The present invention provides a technique advantageous in suppressing deterioration of imprint performance for a partial shot region.

The present invention in its one aspect provides an imprint method of performing an imprint process for a shot region of a substrate using a mold, wherein the substrate includes a valid region where a chip is to be formed, and an invalid region outside the valid region where no chip is to be formed, and the invalid region is a region formed by etching an outer region outside the valid region, and the method includes deciding, based on a height difference between the valid region and the invalid region, an imprint condition for a partial shot region defined by an outer edge of the valid region, and performing the imprint process for the partial shot region in accordance with the decided imprint condition.

Further features of the present invention will become apparent from the following description of exemplary embodiments (with reference to the attached drawings).

BRIEF DESCRIPTION OF THE DRAWINGS

FIGS. 3A and 3B are views showing an arrangement example of mold-side marks and an arrangement example of substrate-side marks, respectively;

FIGS. 6A to 6D are views each illustrating the structure of a substrate end portion;

FIG. 11 is a view for explaining an imprint condition adjustment procedure;

FIGS. 12A to 12D are views for explaining an example of substrate processing;

FIG. 13 is a flowchart illustrating an imprint method; and

DESCRIPTION OF THE EMBODIMENTS

Figure 1:
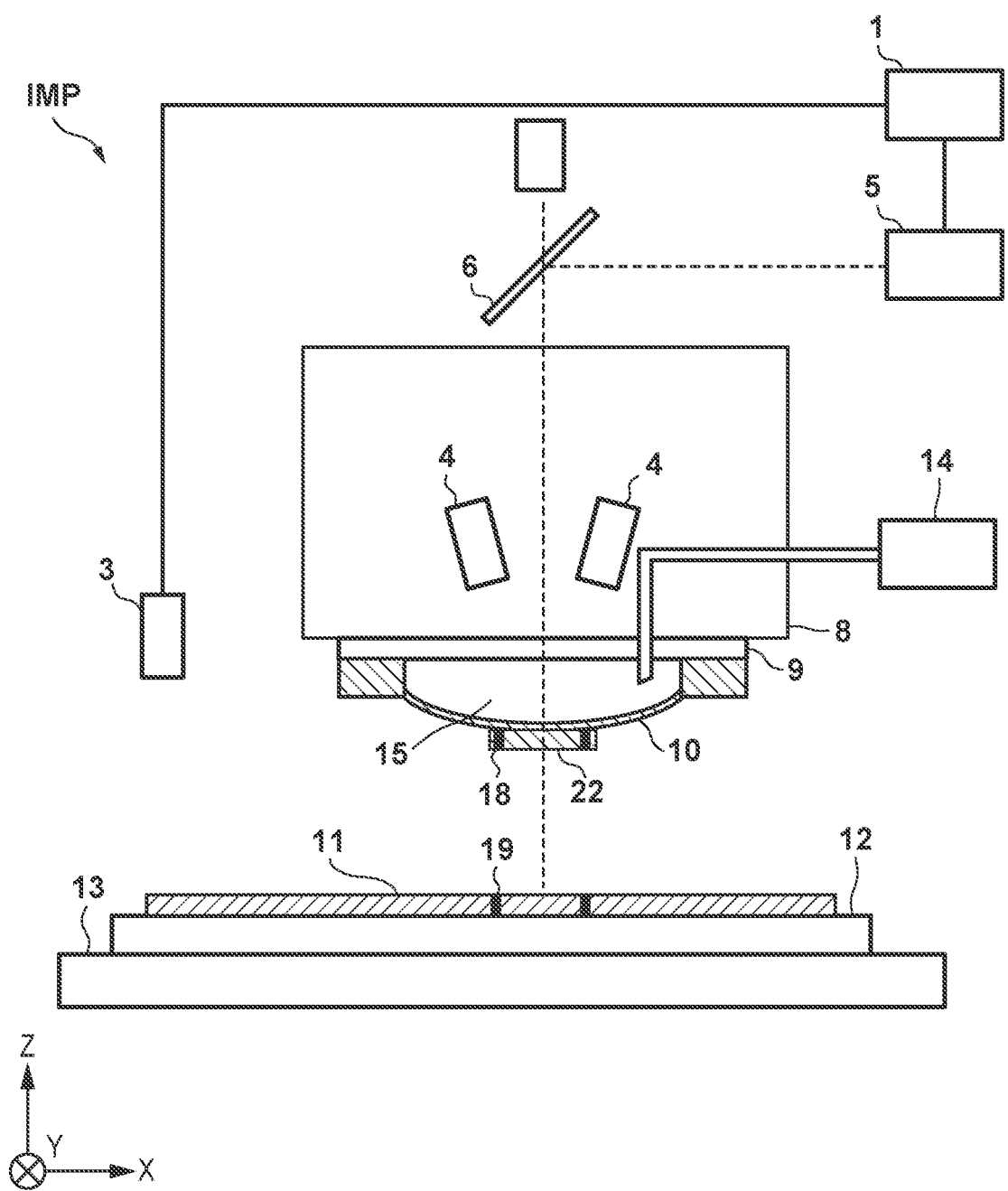
FIG. 1 is a view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Firstly, an overview of an imprint apparatus according to an embodiment will be described. The imprint apparatus is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa·s or more and 100 mPa·s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

First Embodiment

FIG. 1 is a schematic view showing an imprint apparatus IMP according to this embodiment. In the specification and the drawings, directions will be indicated by an XYZ coordinate system in which the horizontal surface is set as the X-Y plane. A substrate holder 12 to be described later holds a substrate 11 on the holding surface of the substrate holder 12 such that the surface of the substrate 11 is parallel to the horizontal surface (X-Y plane). Therefore, in the following description, the directions orthogonal to each other in a plane along the holding surface of the substrate holder 12 are the X-axis and the Y-axis, and the direction perpendicular to the X-axis and the Y-axis is the Z-axis. Further, in the following description, directions parallel to the X-axis, the Y-axis, and the Z-axis of the XYZ coordinate system are referred to as the X direction, the Y direction, and the Z direction, respectively, and a rotational direction around the X-axis, a rotational direction around the Y-axis, and a rotational direction around the Z-axis are referred to as the θx direction, the θy direction, and the θz direction, respectively. Examples of a curing method of an imprint material are a photo-curing method of curing an imprint material by irradiation of ultraviolet light, and a heat curing method of curing an imprint material by heat. Either one of them may be employed, but the photo-curing method is employed in this embodiment.

In FIG. 1, a controller 1 can be formed by at least one computer that includes a CPU and a memory. The controller 1 can be connected to the respective components of the imprint apparatus IMP via lines, and control operations, adjustments, and the like of the respective components of the imprint apparatus IMP in accordance with programs stored in the memory.

A mold 10 can be formed of quartz or the like that can transmit ultraviolet light. The mold 10 includes a pattern surface 22 with a pattern such as a circuit pattern formed on the surface facing the substrate 11. The pattern surface 22 is a contact region to be brought into contact with the imprint material on a substrate. Mold-side marks (first marks) 18 are formed in the pattern surface 22. A mold holder 9 chucks or attracts and holds the mold 10 with a vacuum suction force or an electrostatic force.

The substrate 11 is a substrate to which the pattern of the mold 10 is to be transferred. The substrate 11 can be, for example, a single crystal silicon substrate or an SOI (Silicon on Insulator) substrate. Substrate-side marks (second marks) 19 are formed in each of a plurality of shot regions on the substrate 11. The substrate holder 12 chucks or attracts and holds the substrate 11 with a vacuum suction force or an electrostatic force.

A detector 4 is formed by scopes each of which optically detects (observes) the mold-side mark 18 and the substrate-side mark 19. The detector 4 is only required to detect the relative positional relationship between the mold-side mark 18 and the substrate-side mark 19. Accordingly, the detector 4 may be formed by scopes each including an optical system for simultaneously capturing two marks, or may be formed by scopes each of which detects a signal reflecting the relative positional relationship between two marks, such as an interference signal or moire. The detector 4 may not be able to simultaneously detect the mold-side mark 18 and the substrate-side mark 19. For example, the detector 4 may detect the relative positional relationship between the mold-side mark 18 and the substrate-side mark 19 by obtaining the position of the mark-side mark 18 and the position of the substrate-side mark 19 with respect to a reference position arranged inside. The controller 1 can control the position of a substrate driver 13 based on the detection result of the detector 4.

A supplier 3 supplies an imprint material onto the substrate 11. The controller 1 controls the substrate driver 13 to drive the substrate holder 12 (that is, the substrate 11) in the X and Y directions so as to locate the shot region of the substrate 11 below the supplier 3. After this, the supplier 3 supplies the imprint material onto the shot region (supply step). The supplier 3 may supply the imprint material collectively to the plurality of shot regions or for each shot region which is brought into contact with the mold 10 in the imprint process. Note that the supplier 3 can be arranged outside the imprint apparatus IMP. In this case, the imprint material is supplied onto the substrate 11 before the substrate 11 is loaded to the imprint apparatus IMP.

After the imprint material is supplied, the controller 1 controls the substrate driver 13 to drive the substrate holder 12 in the X and Y directions so as to locate the shot region below the mold 10. After this, the controller 1 controls the mold driver 8 to move the mold 10 to the substrate 11 side (−Z direction) and bring the mold 10 into contact with the imprint material on the shot region (contact step). In the contact step, the contact may be performed by driving the mold 10 in the −Z direction by the mold driver 8, or the contact may be performed by driving the substrate 11 to the mold 10 side (+Z direction) by the substrate driver 13. Alternatively, the contact may be performed by both driving of the mold driver 8 and driving of the substrate driver 13. That is, in this embodiment, the mold driver 8 and the substrate driver 13 form a relative driving mechanism that relatively drives the mold holder 9 and the substrate holder 12 so as to change the spacing between the mold 10 and the substrate 11 in order to adjust the relative position between the mold 10 and the substrate 11.

The imprint apparatus IMP can include a deforming device 14 that deforms the pattern surface 22 into a convex shape toward the substrate 11 by applying a pressure to an air chamber 15 which is a space on the opposite side of the pattern surface 22 of the mold 10. The controller 1 can deform the shape of the mold 10 into a convex shape toward the substrate 11 side by controlling, using the deforming device 14, the pressure in the air chamber 15 between the mold 10 and the mold holder 9 when bringing the mold 10 and the imprint material on the substrate 11 into contact with each other. This operation is performed to prevent that air is trapped in the imprint material upon bringing the mold 10 and the imprint material on the substrate 11 into contact with each other. The controller 1 performs processing of bringing the pattern surface 22 and the imprint material on the substrate 11 into contact with each other while controlling the deformation of the pattern surface 22 by the deforming device 14. The mold holder 9 may further include a shape corrector (not shown) that corrects the shape (shot shape) of the mold 10 (pattern surface 22) by applying an external force to a plurality of portions of the side surface of the mold 10. The shape corrector can deform the mold 10 in accordance with the shape of the pattern already formed on the substrate.

After the mold 10 and the imprint material on the substrate 11 start to contact each other, the mold driver 8 drives to the substrate 11 side (−Z direction) to increase the contact area. This driving may be performed by the control based on the distance between the mold 10 and the substrate 11, or may be performed by the control based on the force received by the mold 10. The pressure control of the air chamber 15 and the control of the mold driver 8 are simultaneously performed so as to allow the entire surface of the pattern surface 22 to come into contact with the imprint material on the substrate 11. An operation of, after the start of contact between the mold 10 and the imprint material on the substrate 11, spreading the imprint material over the entire surface of the pattern surface 22 by advancing the contact is referred to as "imprint" hereinafter.

As has been described above, the mold driver 8 and the substrate driver 13 form the relative driving mechanism that drives at least one of the substrate 11 and the mold 10 so as to adjust the relative position between the mold 10 (the pattern surface 22 thereof) and the substrate 11. The adjustment of the relative position by the relative driving mechanism includes driving for bringing the pattern surface 22 of the mold 10 into contact with the imprint material on the substrate 11 and driving for separating the pattern surface 22 from the cured product of the imprint material. The substrate driver 13 can be a driving mechanism having a plurality of degrees of freedom (for example, three axes of the X-axis, the Y-axis, and the θz-axis, and preferably six axes of the X-axis, the Y-axis, the Z-axis, the θx-axis, the θy-axis, and the θz-axis). The mold driver 8 can also be a driving mechanism having a plurality of degrees of freedom (for example, three axes of the Z-axis, the θx-axis, and the θy-axis, and preferably six axes of the X-axis, the Y-axis, the Z-axis, the θx-axis, the θy-axis, and the θz-axis).

Figure 2:
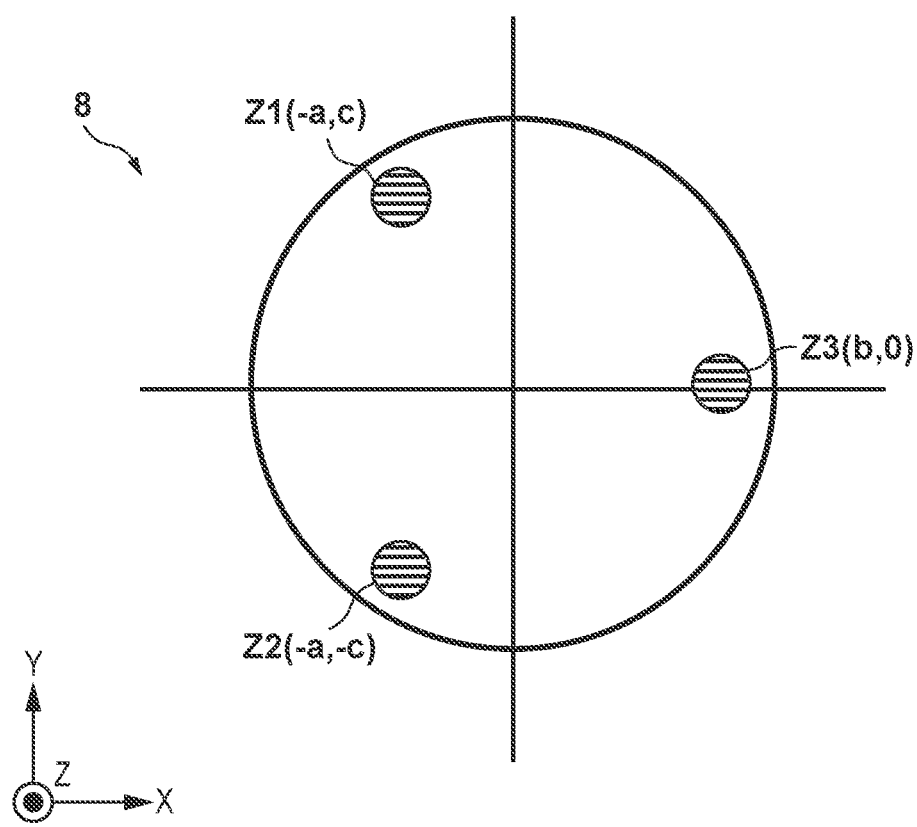
FIG. 2 is a view showing the arrangement of a mold driver.

As illustrated in FIG. 2, the mold driver 8 can include three driving systems Z1, Z2, and Z3 that drive the mold holder 9 in the Z direction. Each of the driving systems Z1, Z2, and Z3 includes, for example, a sensor that detects the position in the Z direction and the force acting in the Z direction. Based on outputs from these sensors, the position and posture of the mold 10 and the force applied to the mold 10 can be controlled.

For example, when the driving systems Z1 and Z2 push the mold 10 to the substrate 11 side (−Z direction) and the driving system Z3 pushes the mold 10 to the opposite side (+Z direction) of the substrate 11, the mold 10 can be tilted to the +X direction. By the control as described above, it is possible to perform posture control in accordance with the tilt (control in the θx and θy directions) of the pattern surface 22 of the mold 10 and the tilt and/or in-plane shape of the substrate 11.

After the imprint material spreads over the entire region of the pattern surface 22, curing energy is applied to the imprint material to cure the imprint material (curing step). The curing energy is generated by a light source 5, and applied to the imprint material via a beam splitter 6 and the mold 10. After the imprint material is cured, the controller 1 drives the mold driver 8 to the opposite side (+Z direction) of the substrate 11 to separate the pattern surface 22 of the mold 10 from the imprint material (mold separation step).

With the steps described above, patterning for one shot region is completed. The imprint apparatus IMP may include a camera 23 that captures the imprint material to check the state of the imprint material in each of the above-described contact step, curing step, and mold separation step.

If there is another shot region supplied with the imprint material in the substrate 11, the substrate driver 13 is driven to locate the region for next patterning below the mold 10, and the contact step, the curing step, and the mold separation step are performed. If there is not another shot region supplied with the imprint material in the substrate 11, the imprint material is supplied onto a new shot region. If there is no shot region for patterning in the substrate 11, the substrate 11 is released from the substrate holder 12 and unloaded to the outside of the substrate holder 12.

With reference to FIGS. 3A and 3B, the mold-side marks 18 and the substrate-side marks 19 as the alignment marks used for alignment between the mold 10 and the substrate 11 will be described. In this embodiment, six chip regions are arranged in one shot region on the substrate 11.

FIG. 3A shows mold-side marks 18a to 18h formed in four corners of the pattern surface 22 of the mold 10. For example, the mold-side marks 18a, 18b, 18e, and 18f each having the longitudinal direction in the horizontal direction are marks each having the measurement direction in the X direction. The mold-side marks 18c, 18d, 18g, and 18h each having the longitudinal direction in the vertical direction are marks each having the measurement direction in the Y direction. In FIG. 3A, regions surrounded by dashed lines indicate pattern regions where the patterns to be transferred to the six chip regions, respectively, are formed.

FIG. 3B shows substrate-side marks 19a to 19h formed in four corners of one shot region 13a on the substrate 11. For example, the substrate-side marks 19a, 19b, 19e, and 19f each having the longitudinal direction in the horizontal direction are marks each having the measurement direction in the X direction. The substrate-side marks 19c, 19d, 19g, and 19h each having the longitudinal direction in the vertical direction are marks each having the measurement direction in the Y direction. In FIG. 3B, region surrounded by solid lines inside the shot region 13a indicate the chip regions.

When performing the imprint process, more specifically, when bringing the mold 10 and the imprint material on the substrate 11 into contact with each other, the mold-side marks 18a to 18h and the substrate-side marks 19a to 19h are located close to each other, respectively. Accordingly, by detecting the mold-side marks 18 and the substrate-side marks 19 by the detector 15, the shape and position of the pattern surface 22 of the mold 10 can be compared with the shape and position of the shot region 13a of the substrate 11. If a large difference (shift) is generated between the shape and position of the pattern surface 22 of the mold 10 and the shape and position of the shot region 13a of the substrate 11, the overlay error exceeds the allowable range, resulting in poor pattern transfer (product defects).

Figure 4A:
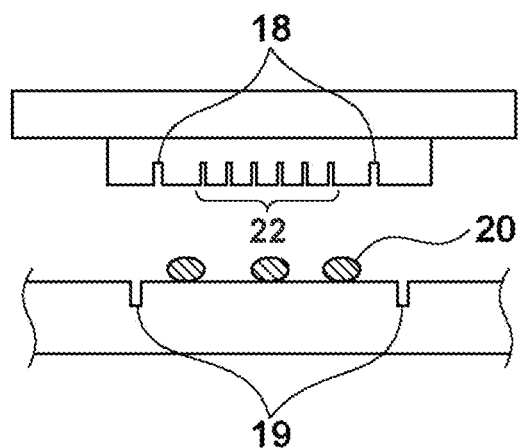
FIGS. 4A to 4C are views for explaining an imprint process.
Figure 4B:
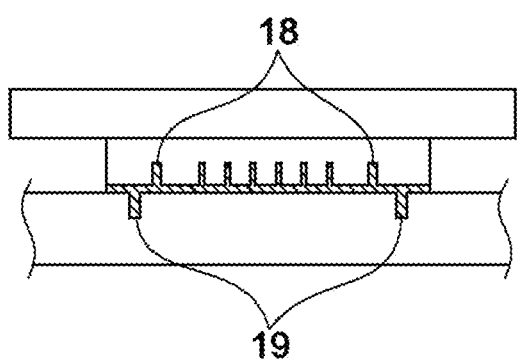
Figure 4C:
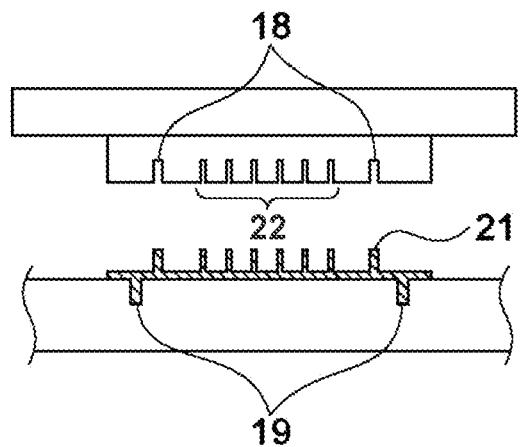

With reference to FIGS. 4A to 4C, how the pattern of the mold 10 is transferred to the imprint material on the substrate by the imprint process will be described. As shown in FIG. 4A, an imprint material 20 is supplied onto the shot region before the contact step is started. Since the imprint material generally has high volatility, the imprint material is supplied immediately before the imprint process. If the imprint material has low volatility, the imprint material may be applied to the entire surface of the substrate in advance by spin coating or the like. In addition, in order to prevent the imprint material from peeling off from the substrate in the mold separation step, a material that improves adhesion is generally applied between the imprint material and the substrate in advance.

Then, as shown in FIG. 4B, in the contact step, the mold 10 comes into contact with the imprint material, and the imprint material is filled in the pattern portion (concave-convex structure) of the mold 10. Since the imprint material transmits visible light, the detector 4 can observe the substrate-side marks 19. In addition, in order to cure the imprint material by violet light, the mold 10 is formed of a transparent material such as quartz. Therefore, the difference in refractive index between the mold 10 and the imprint material is small, and there can be a case in which the mold-side marks 18 cannot be measured based on the concave-convex structure alone. To prevent this, there has been proposed a method in which the mold-side marks 18 are formed of a material having the refractive index or transmittance different from that of the mold 10, or a method in which the refractive index of the mark portion of the mold 10 is changed by ion irradiation or the like. By using the method as described above, the detector 4 can measure the mold-side marks 18 even in the state shown in FIG. 4B.

FIG. 4C shows a state in which, via the curing step and the mold separation step, the mold 10 is separated from the imprint material. After the mold separation is completed, a pattern 21 of the cured imprint material remains on the substrate. Thus, the pattern of the mold 10 is transferred onto the substrate.

Figure 5:
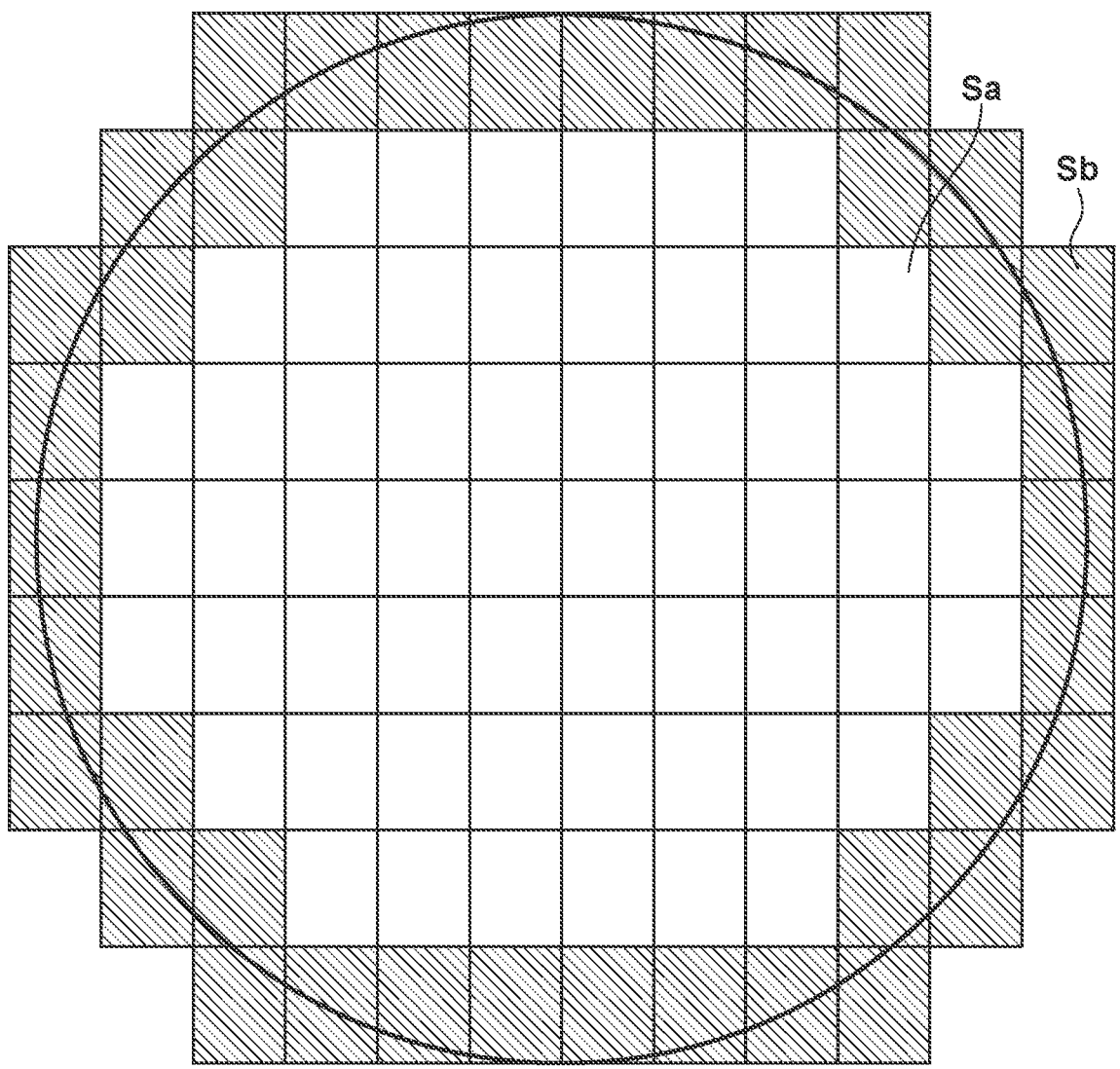
FIG. 5 is a view illustrating the shot layout of a substrate.

FIG. 5 illustrates a general circular substrate and the layout (shot layout) of a plurality of shot regions arranged in the substrate. The plurality of shot regions can include a full shot region Sa (full field) where the entire pattern of the mold 10 is transferred, and a partial shot region Sb (partial field) where only a part of the pattern of the mold 10 is transferred because it is located in the outer periphery portion of the substrate. A shot region that has no "omission" but has a corner only contacting the outer periphery of the substrate and a shot region near the outer periphery of the substrate may also be classified as the partial shot regions. The substrate includes a valid region where a chip is to be formed, and an invalid region outside the valid region where no chip is to be formed. For example, a region within a predetermined distance from the outer peripheral edge of the substrate can be regarded as the invalid region that is not targeted by the imprint process because it is readily influenced by a process in a previous step, or according to the standard of the substrate storage device. A shot region partially overlapping the invalid region may also be classified as the partial shot region. Accordingly, it may be understood that the partial shot region is a shot region defined by the outer edge of the valid region.

In an example, a plurality of chip pattern regions are formed in the mold 10, and a plurality of chip regions are formed in the full shot region of the substrate so as to correspond to the plurality of chip pattern regions. If the plurality of chip patterns of the mold 10 are the same pattern, chips having the same pattern are formed in the plurality of chip regions in the full shot region of the substrate. Each chip functions as a device. Therefore, if at least one chip is formed in the partial shot region Sb, the production amount of devices formed by the imprint process can be increased.

When bringing the mold 10 into contact with the substrate via the imprint material in the imprint process, for example, the supply (application) state of the imprint material changes between the transfer region and the region outside the transfer region. When supplying the imprint material in the imprint apparatus IMP, if the imprint material is supplied right up to the outer periphery of the substrate, the imprint material may extrude to the outside of the substrate. To prevent this, in general, the imprint material is not supplied in a predetermined range in the substrate end portion. Further, in spin coating, in order to prevent the imprint material in the substrate end portion from peeling off in the apparatus and generating dust, after the imprint material is applied to the entire surface, an edge rinse step of removing the imprint material in the substrate end portion is performed. To prevent fine particles, a step of polishing the substrate outer peripheral portion (Bebel polishing step) can also be performed.

Based on the above description, the section upon performing the imprint process for the partial shot region Sb is shown in each of FIGS. 6A to 6D. FIG. 6A shows a state before the mold 10 is brought into contact with the imprint material 20 on the substrate 11. As has been described above, the imprint material 20 is not supplied up to the substrate end. Further, in the example shown in FIG. 6A, the end portion of the substrate 11 is not processed.

FIG. 6B shows a state in which the mold 10 is in contact with the imprint material 20 on the substrate 11. At this time, the mold 10 is deformed due to various kinds of imprint conditions, self-weight deflection, and the like, but the portion imprinted against the substrate 11 via the imprint material 20 has a shape following the flat surface of the substrate 11. On the other hand, in the substrate end without the imprint material 20 between the mold 10 and the substrate 11, the mold 10 is deformed. At this time, the imprint material 20 spreads toward the substrate end, but its thickness gradually decreases as the gap between the mold 10 and the substrate 11 decreases due to the deformation of the mold 10. A region where the imprint material 20 exists very thin or no imprint material 20 exists is generated, resulting in generation of a region where the mold 10 contacts the substrate 11. After this, relative alignment driving is performed based on the measurement result of the relative position between the substrate-side mark and the mold-side mark. However, in the state in which the mold 10 is almost in direct contact with the substrate 11, a large shear force is generated between the mold 10 and the substrate 11, so that it is impossible or difficult to drive them. Further, in the state in which the mold 10 is almost in direct contact with the substrate 11, even if they can be driven, the mold 10 may be partially broken or damaged. If the mold 10 contacts the imprint material 20 in a region where no adhesive material exists due to edge rinsing or the like, or if an uneven thickness of the imprint material is generated, a part of the imprint material 20 can adhere to the mold 10 upon separating the mold 10 from the imprint material 20. Since the imprint material adhering to the mold 10 can affect the imprint performance for the next shot region, it is required to prevent such adhesion.

FIG. 6C shows a structure in which a slope is formed in the end portion of the substrate 11, and FIG. 6D shows a structure in which a step is provided in the end portion of the substrate 11. By providing such a slope or step, direct contact between the mold 10 and the substrate 11 can be avoided.

Figure 9:
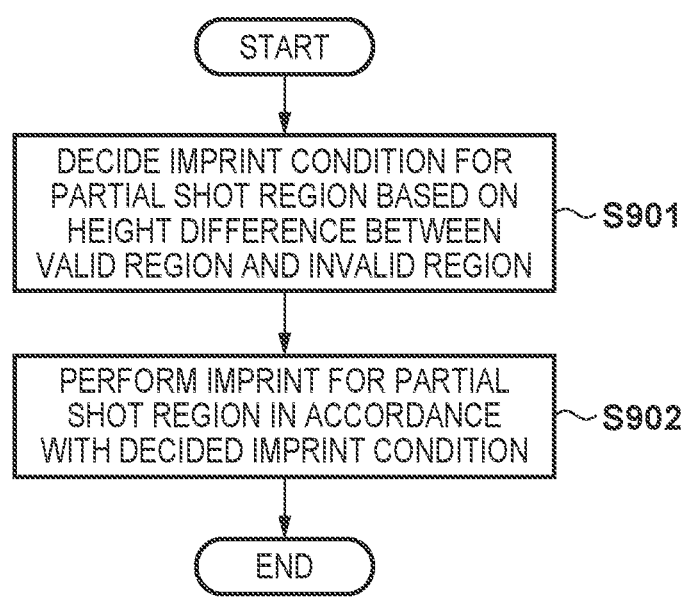
FIG. 9 is a flowchart illustrating an imprint method for a partial shot region.

FIG. 9 is a flowchart illustrating an imprint method of performing an imprint process for a partial shot region according to this embodiment. As has been described above, the substrate includes a valid region where a chip is to be formed, and an invalid region outside the valid region where no chip is to be formed. The invalid region is, for example, a region where a slope or step as described above has been formed by etching the outer region outside the valid region. In step S901, the controller 1 decides an imprint condition for a partial shot region based on the height difference between the valid region and the invalid region. Then, in step S902, the controller 1 performs an imprint process for the partial shot region in accordance with the imprint condition decided in step S901.

When the imprint process is performed in the structure as shown in FIG. 6C or 6D, as compared to the structure as shown in FIG. 6B, the mold 10 is unlikely to contact the substrate 11, so that deterioration of imprint performance for the partial shot region can be suppressed. However, if the deformation of the mold 10 is larger than the slope or step amount in the end portion of the substrate 11, a phenomenon as shown in FIG. 6B can occur. To prevent this, an imprint method considering even the deformation of the mold 10 as described below may be performed.

Figure 7A:
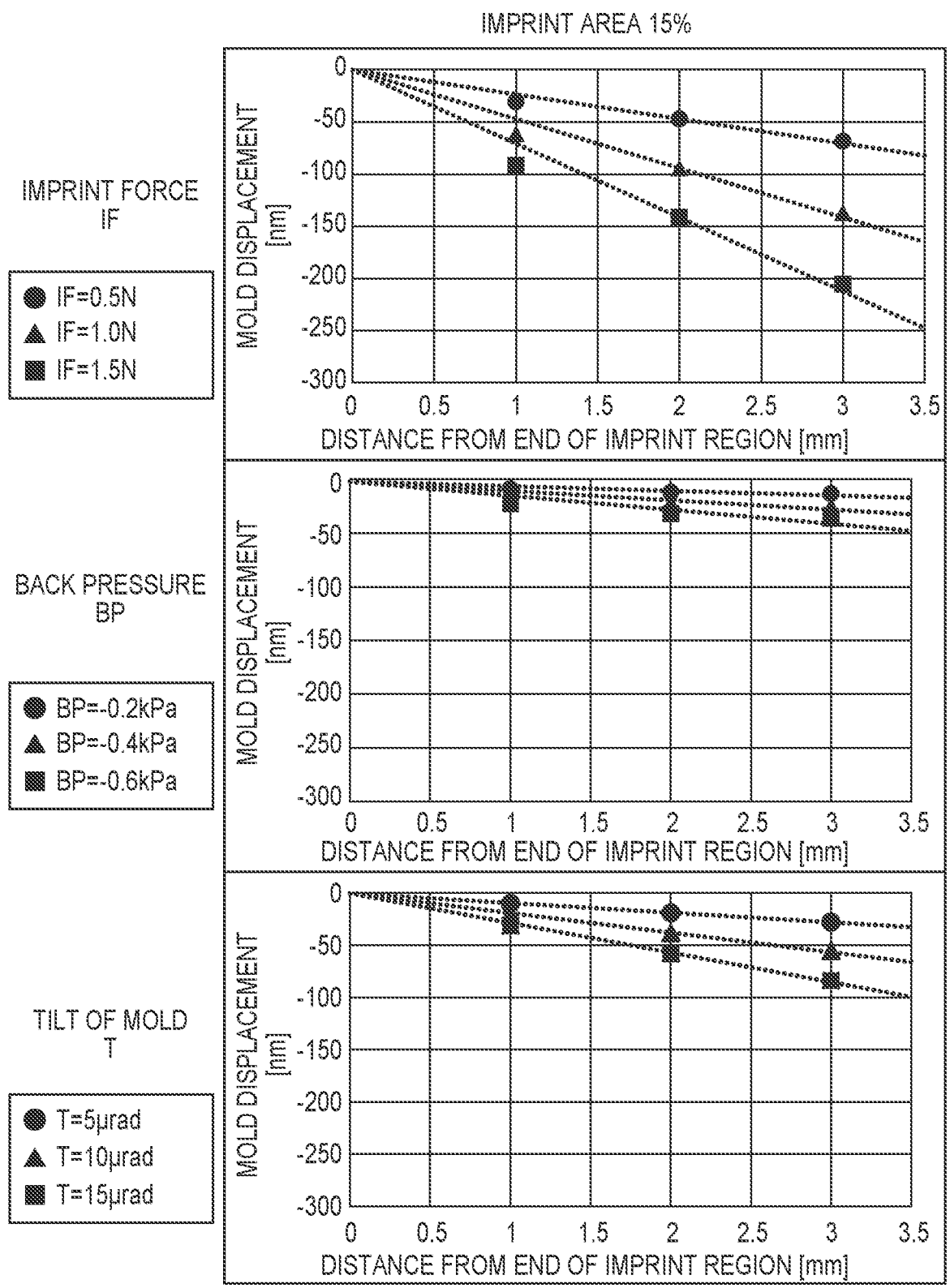
FIGS. 7A to 7C are views showing simulation results of mold deformations in the imprint process for the substrate end portion.
Figure 7B:
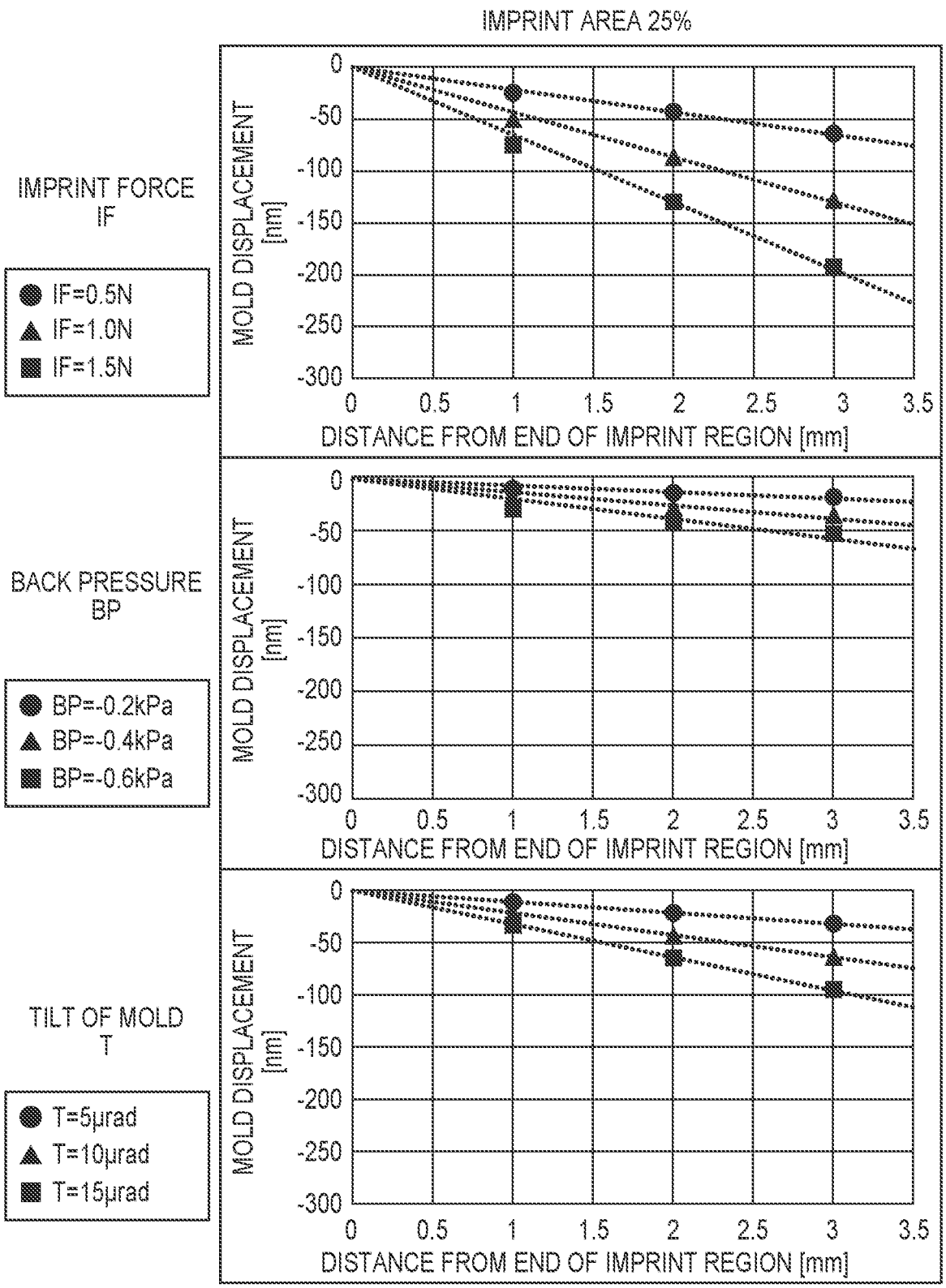
Figure 7C:
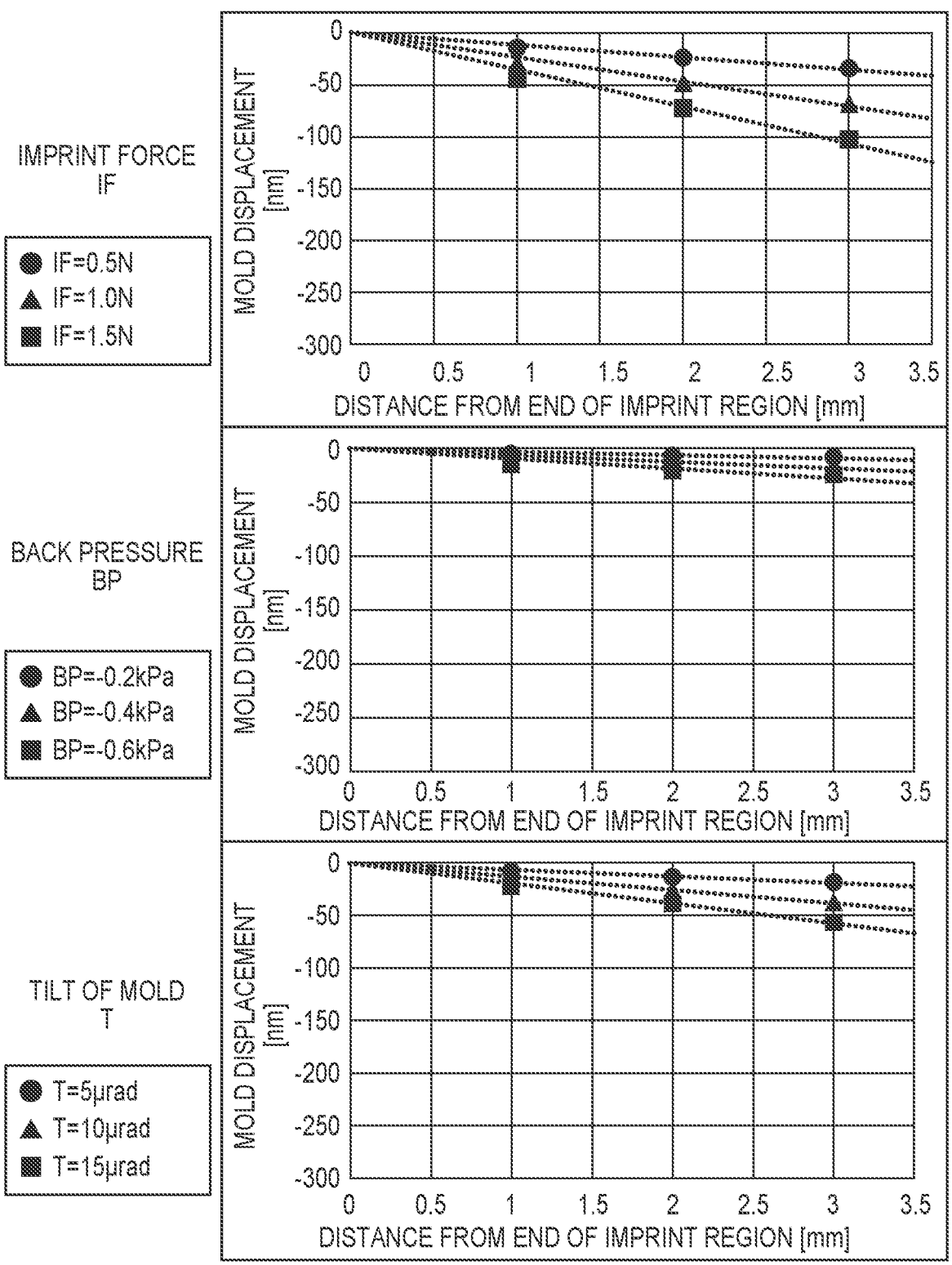

FIGS. 7A-C show the estimated result, obtained by a simulation, of the influence of the condition, among various imprint conditions, that causes a large displacement (deformation) of the mold from the contact surface in the imprint region in the imprint process for the substrate end. The imprint conditions can include a plurality of conditions. In an example, the plurality of conditions can be an imprint force, a back pressure, and the tilt of the mold. FIGS. 7A-C show simulation results for the mold 10 with a thickness of 1 mm. The imprint force (IF) indicates the magnitude of a relative force in the Z direction upon bringing the mold 10 into contact with the imprint material 20 on the substrate 11. The imprint force may be changed in a period from the contact between the mold 10 and the imprint material 20 to the separation thereof. However, since the timing at which the condition influences this problem changes among the imprint conditions, the timing for the force to be considered is selected by preliminary evaluation or the study of the sequence. An example of the influence timing of the force is the timing for the imprint force at which the mold 10 and the substrate 11 are driven for relative alignment.

The back pressure (BP) indicates the magnitude of the force applied to deform the mold 10 into a convex shape toward the substrate 11 side. This force is controlled since the relative shot shape changes in accordance with the convex shape of the mold 10 during imprint. The mold 10 may be deformed by direct contact, or the air pressure in a space in the upper portion of the mold 10 may be changed. In this simulation, a model was employed in which the pressure in the air chamber 15, which is the space in the upper portion of the mold 10, is changed by the deforming device 14.

The tilt of the mold (T) indicates the amount by which the mold 10 is tilted about the X-axis and the Y-axis by controlling the mold 10 in the θx and θy directions by the mold driver 8.

The imprint area indicates the area of the imprint region (the region where the imprint material exists). The imprint area may be expressed by the ratio (area ratio) of the area of the imprint region (the region where the imprint material exists) to the area of the pattern surface 22 of the mold 10. The area ratio is 100% for the full shot region, and less than 100% for the partial shot region in accordance with the position of the substrate end portion. FIGS. 7A-C show examples for the areas of 15%, 25%, and 50%. In general, the smaller the area ratio, the larger the mold deformation outside the imprint region.

Figure 8A:
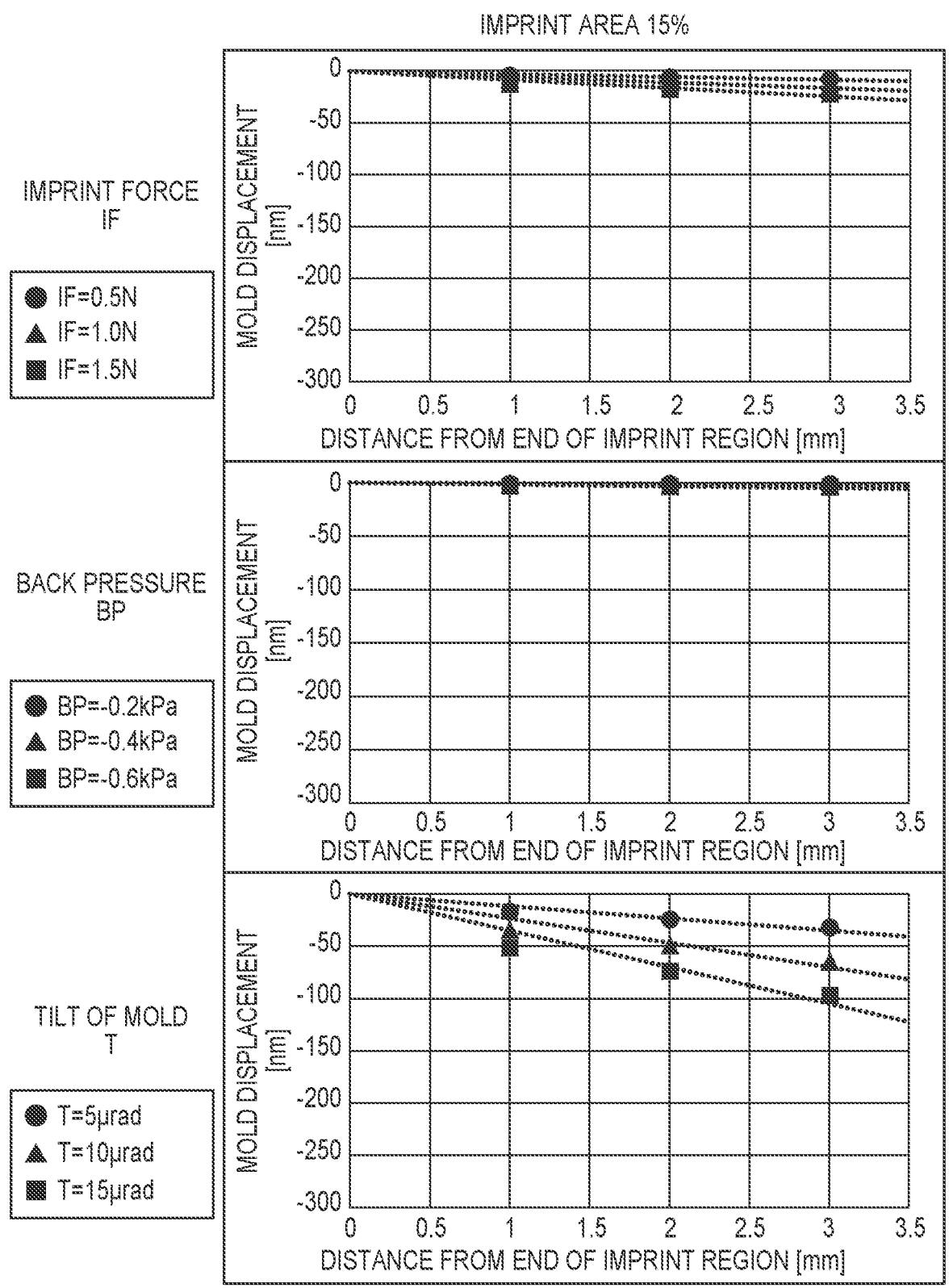
FIGS. 8A to 8C are views showing simulation results of mold deformations in the imprint process for the substrate end portion.
Figure 8B:
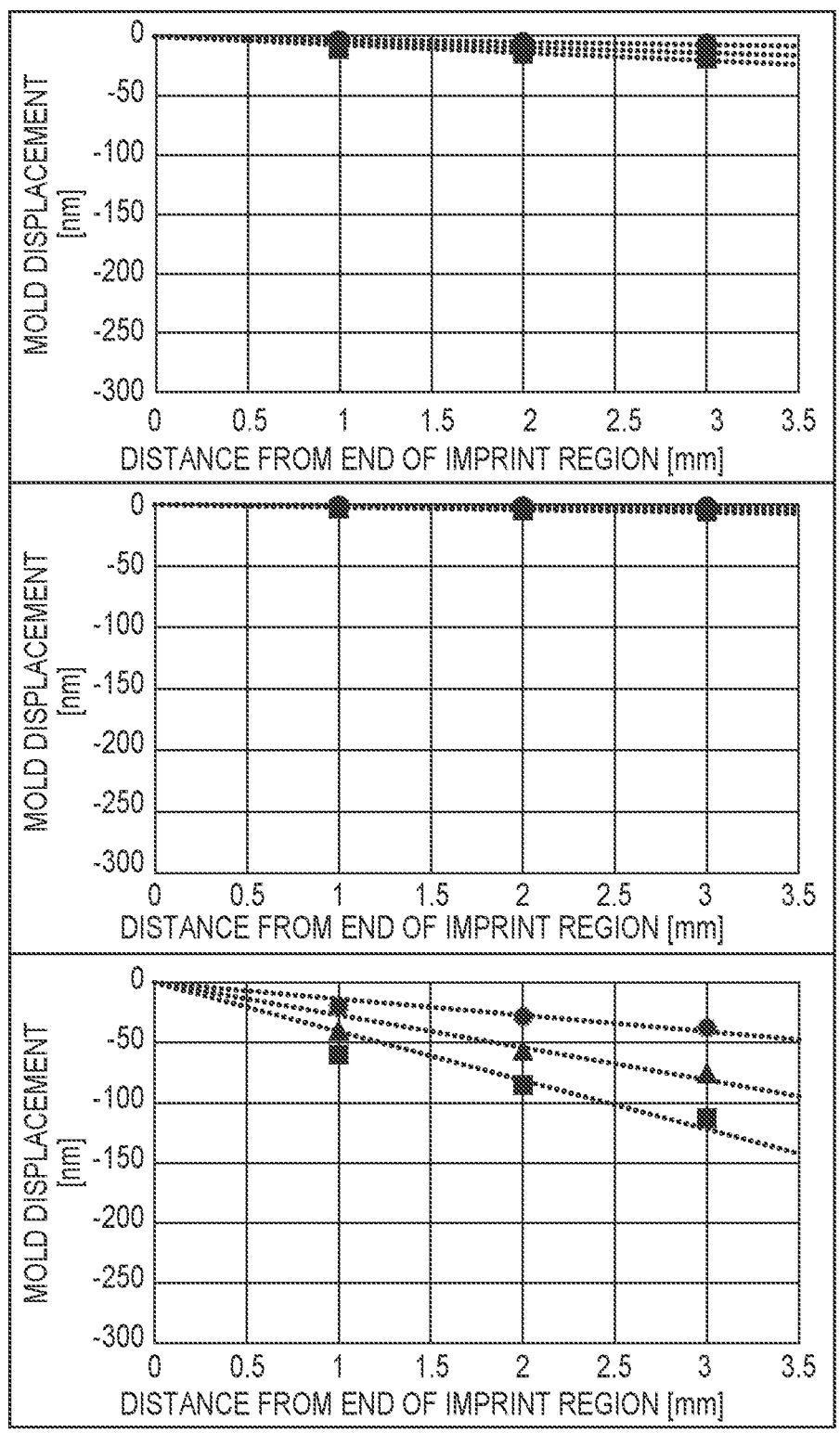
Figure 8C:
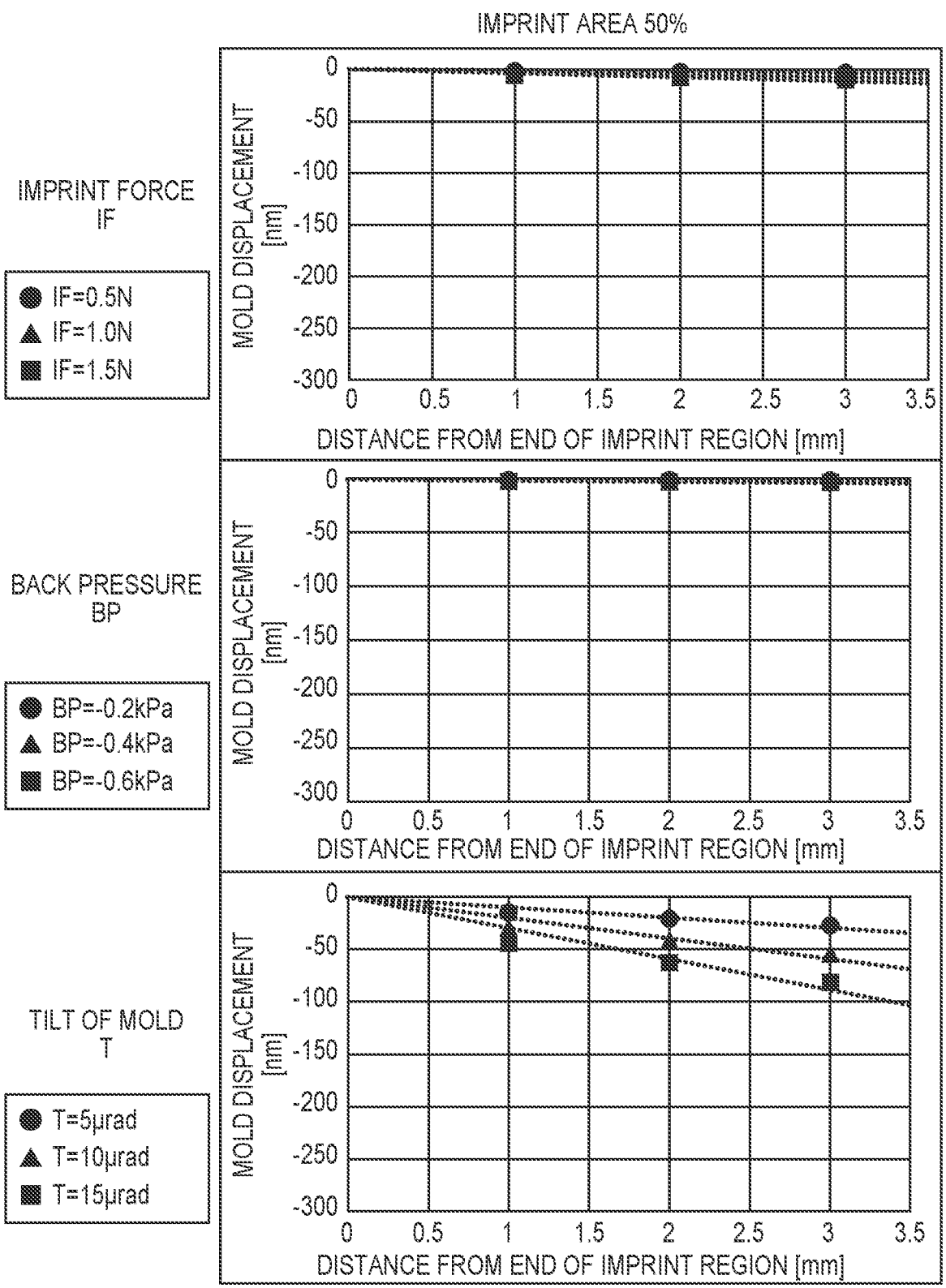

The abscissa of each graph in FIGS. 7A-C represent the distance from the end of the imprint region, which is set at 0, to the region where the mold 10 can be deformed outside the imprint region (See FIGS. 6A to 6D). The ordinate represents the displacement of the mold 10. Referring with FIGS. 7A-C, it can be seen that the displacement of the mold 10 tends to increase as the distance from the end of the imprint region increases. It can also be seen that the displacement of the mold 10 changes depending on the imprint area and the imprint conditions (the imprint force, the back pressure, and the tilt of the mold). As a comparative example, FIGS. 8A-C show simulation results for the mold 10 with a thickness of 3 mm. It can be seen that when the thickness of the mold increases, the deformation of the mold with respect to each of the change in imprint force and the change in back pressure decreases. However, the tilt of the mold T indicating the tilt of the entire mold shows almost the same result as in FIGS. 7A-C even when the thickness of the mold increases.

The imprint conditions (the imprint force, the back pressure, and the tilt of the mold) can occur simultaneously. Accordingly, by calculating the displacement for each imprint condition and adding the obtained displacements, the mold displacement in the imprint process can be obtained. By obtaining the mold displacement with respect to the substrate surface in the substrate end, it is possible to perform the imprint process with the conditions with which the mold 10 does not directly contact the substrate 11.

Figure 10:
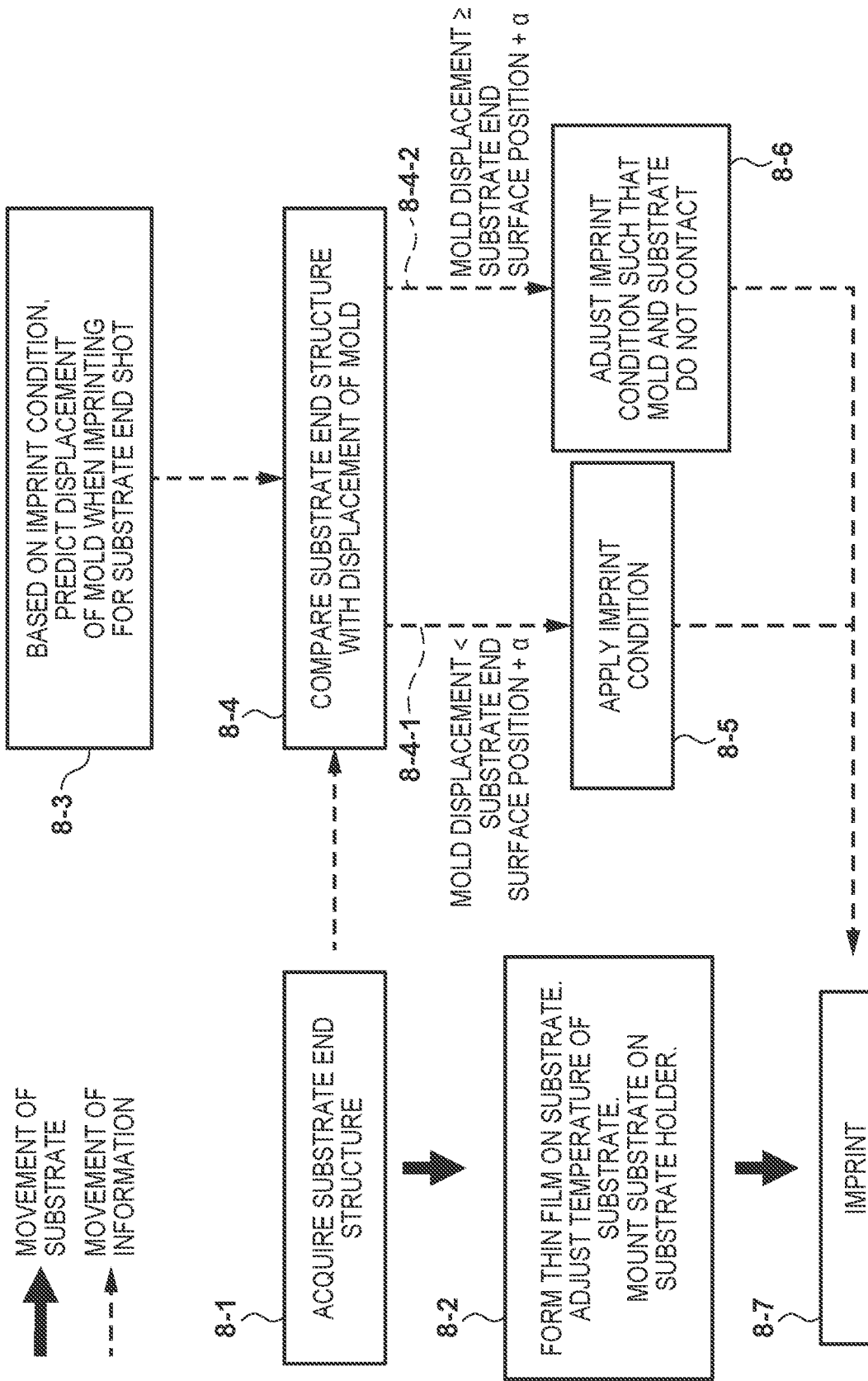
FIG. 10 is a flowchart illustrating an imprint sequence.

With reference to FIG. 10, the imprint sequence in this embodiment will be described.

First, in step 8-1, the controller 1 acquires the information of the uneven structure (substrate end structure) of the substrate end portion (invalid region). The height difference between the valid region and the invalid region is obtained from the information of the substrate end structure. The information of the substrate end structure is acquired using, for example, a measurement system combining a measurement device such as a laser displacement meter or a confocal microscope that can measure the position in the height direction, and a stage that can be driven to a predetermined position while holding the substrate. The substrate end structure may be predicted or estimated based on at least any of the design condition and the processing condition of the substrate. However, if the substrates vary, or if a sampling inspection for every predetermined number of substrates is needed, it is required to perform the measurement as appropriate.

Step 8-2 is a step of preparing a substrate for an imprint process. The step of preparing the substrate can include forming a thin film on the substrate, adjusting the temperature of the substrate, measuring the outer shape of the substrate, mounting the substrate on the substrate holder 12, and the like. Note that the order of all or part of step 8-1 and all or part of step 8-2 may be reversed. For example, since the original purpose is to measure the structure of the substrate at the time of the imprint process, it is desirable to measure the substrate end structure after all of the various kinds of steps for the substrate are completed and the substrate is mounted on the substrate holder 12. However, since the imprint process cannot be performed during the measurement, this leads to a decrease in productivity. To avoid this, the measurement and the imprint process may be performed in parallel by performing the measurement by another unit before mounting the substrate on the substrate holder 12. When the measurement is performed in advance outside the imprint apparatus IMP, the change in the substrate end structure in each of the various kinds of steps performed on the substrate is predicted.

As has been described above, the relationship between the imprint condition and the displacement (mold displacement) of the mold 10 in the imprint process is obtained in advance from the simulation results as shown in FIGS. 7 and 8. In step 8-3, the controller 1 predicts, based on the relationship, the mold displacement in an imprint process performed for a shot region (partial shot region) in the substrate end under a temporarily set imprint condition. The controller 1 can predict the mold displacement from the temporarily set imprint condition. Note that the mold displacement may be predicted based on the simulation results as shown in FIGS. 7 and 8, or may be predicted based on results obtained by actually performing imprint processes in advance while changing various kinds of imprint conditions.

In step 8-4, the controller 1 compares the substrate end structure (height difference obtained therefrom) acquired in step 8-1 with the predicted displacement of the mold obtained in step 8-3. For example, for the substrate end structure including the step as shown in FIG. 6D, if the depth of the substrate surface outside the imprint region is larger than the maximum predicted displacement of the mold 10, direct contact between the mold 10 and the substrate 11 is avoided (8-4-1). Note that "+a" is a term indicating a safety coefficient or margin. This is a value that allows for the variation accuracy of the conditions in the imprint process and the variation of the substrate end structure. The degree of margin to be given can be determined based on preliminary evaluations or past performance. For the substrate end structure with the slope as shown in FIG. 6C, the middle of the mold may contact the substrate. Therefore, it is required to obtain not only the maximum predicted displacement of the mold but also the possibility of contact at each position. With the operations described above, if it is confirmed that no contact would occur or the imprint material would not be unacceptably thin, the controller 1 applies this imprint condition to the apparatus in step 8-5, and perform the imprint process in step 8-7.

On the other hand, if it is determined from the comparison result in step 8-4 that direct contact between the mold 10 and the substrate 11 cannot be avoided (step 8-4-2), it is required to set the imprint condition again. In step 8-6, the controller 1 decides the imprint condition by modifying the temporarily set imprint condition based on the height difference obtained from the substrate end structure and the predicted mold displacement. In step 8-6, the controller 1 obtains the allowable amount of the mold displacement from the substrate end structure, and adjusts each imprint condition that can be changed. For example, the imprint force, the back pressure, and the tilt of the mold are adjusted. If the mold is thick, only the tilt of the mold is sensitive to deformation of the mold. Thus, an option of adjusting the tilt of the mold is taken. The imprint conditions such as the imprint force, the back pressure, and the tilt of the mold are associated with not only deformation of the mold but also the performances related to the shape of the transferred pattern, the fillability of the imprint material, and oozing of the imprint material from the end of the mold. Therefore, it is desirable that the information such as the importance, the tolerance, and the sensitivity to each performance of each imprint condition are input in advance, and the imprint conditions are automatically readjusted.

A specific example of the imprint condition adjustment procedure will be described with reference to FIG. 11.

The above-described imprint force, back pressure, and tilt of the mold are parameters that also influence another imprint result. For example, as described in Japanese Patent Laid-Open No. 2013-55327, it is known that changing these parameters lead to a change in relative shot shape between the mold and the substrate. Hereinafter, the relative shot shape between the mold and the substrate is simply referred to as the "shot shape".

Here, assume that, as a result of comparison between the acquired substrate end shape and the mold deformation based on a simulation or preliminary evaluation, it is determined that there is a possibility of contact between the mold and the substrate. In this case, the sensitivity to the shot shape and the sensitivity to deformation of the mold are compared for each of the plurality of condition items (the pressing force, the back surface, and the tilt of the mold). Since the shot shape includes various shapes, and respective items influence different shapes, a desired shape is implemented by combining the imprint conditions. Therefore, the sensitivity to the required shape correction changes among the items.

In this embodiment, based on information of the sensitivity to the shot shape between the mold and substrate and the sensitivity to deformation of the mold with respect to a change in each of a plurality of conditions, the priority of modification of each condition has been decided. For example, in the example shown in FIG. 11, for an item A, the sensitivity to deformation of the mold is high and the sensitivity to the shot shape is low. For an item B, the sensitivity to deformation of the mold and the sensitivity to the shot shape are both intermediate. For an item C, the sensitivity to deformation of the mold is low and the sensitivity to the shot shape is high. Among them, the optimal item to be adjusted is the item for which the sensitivity to the shot shape is low and the sensitivity to deformation of the mold is high (the item C in the example shown in FIG. 10). With such the item, even if the condition is changed so as not to cause the mold 10 to contact with the substrate 11, the influence on the shot shape is small. Thus, this is the most convenient item for this correction. To the contrary, the item with the high sensitivity to the shot shape and the low sensitivity to deformation of the mold should be given a high priority for correction of the shot shape (a low priority is given as the item for contact avoidance). In this manner, the higher priority is given as the sensitivity to the shot shape is lower and the sensitivity to deformation of the mold is higher. These priorities are set in advance, and if it is determined that there is a possibility of contact between the mold 10 and the substrate 11, the imprint condition is modified in the order of the priority.

After this, the controller 1 performs the imprint process in step 8-7.

According to the imprint sequence described above, it is possible to avoid direct contact between the substrate end and the mold while maintaining the transfer accuracy in the imprint process.

Second Embodiment

As the second embodiment, a method of deciding the substrate end structure in accordance with an imprint condition and performing additional processing for the substrate will be described.

From the simulation or preliminary evaluation as shown in FIGS. 7 and 8, the mold deformation for each imprint condition is acquired. Based on the result, additional processing is performed for the substrate end. The procedure of forming a step structure in the substrate end portion will be described with reference to FIGS. 12A to 12D.

First, the imprint material 20 is applied to the entire surface of the substrate 11 (FIG. 12A). At this time, the substrate 11 may include a pattern or film formed in a previous step.

Then, the imprint material 20 in the substrate end is removed by a predetermined width (FIG. 12B). For example, a method is used in which exposure light is applied to the imprint material 20 in the portion to be removed, and the deteriorated imprint material 20 is removed. In addition to this, it is also possible to remove the unnecessary portion only using a chemical solution, but the method based on exposure is desirable to accurately determine the region to be removed. Since the removal width is also related to the size of the imprint region, it is decided based on not only the condition of the device to be formed and the chip layout but also the influence on deformation of the mold.

Next, etching processing of the substrate 11 is performed (FIG. 12C). Here, since the portion where the imprint material 20 has been removed is etched but the portion where the imprint material 20 remains is protected, a step structure is formed in the substrate end portion. The depth of the step structure can be decided based on the above-described simulation or preliminary evaluation.

Finally, the imprint material 20 remaining on the substrate is removed, and the step of forming the step structure in the substrate end is completed (FIG. 12D).

The method of forming the substrate end structure is not limited to this. For example, a bevel polishing device, which polishes a bevel portion to which minute foreign substances easily adhere, may be used to polish the substrate end to a desired structure. However, since the polishing device forms not a step structure but a gentle slope, the above-described etching is more suitable to form the desired structure with which a contact caused by deformation of the mold is unlikely to occur.

By performing the above-described processing step of the substrate before the imprint process, the substrate does not contact the mold even when the imprint process is performed with the required imprint conditions.

FIG. 13 shows a flowchart of an imprint method according to this embodiment. In step S1301, a substrate for an imprint process is prepared. The substrate includes a valid region where a chip is to be formed, and an outer region outside the valid region where no chip is to be formed. The step of preparing the substrate can include forming a thin film on the substrate, adjusting the temperature of the substrate, measuring the outer shape of the substrate, mounting the substrate on the substrate holder 12, and the like. In step S1302, the controller 1 decides the height difference between the valid region and the outer region of the prepared substrate based on the imprint condition for a partial shot region. In step S1303, the outer region is etched in accordance with the decided height difference, thereby forming an invalid region, where no chip is to be formed, outside the valid region of the substrate. After this, in step S1304, the controller 1 performs an imprint process of supplying an imprint material to a shot region on the valid region of the substrate and transferring the pattern of the chip to the imprint material.

According to the imprint method described above, it is possible to avoid direct contact between the substrate end and the mold, so that deterioration of imprint performance for a partial shot region can be suppressed.

<Embodiment of Article Manufacturing Method>

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 14, a substrate $1z$ which is a silicon substrate or the like on whose surface a processing target material $2z$ such as an insulator is formed is prepared, and next, an imprint material $3z$ is applied to the surface of the processing target material $2z$ by an ink-jet method. A state in which the imprint material $3z$ in the form of a plurality of droplets is applied onto the substrate is shown here.

Figure 14:
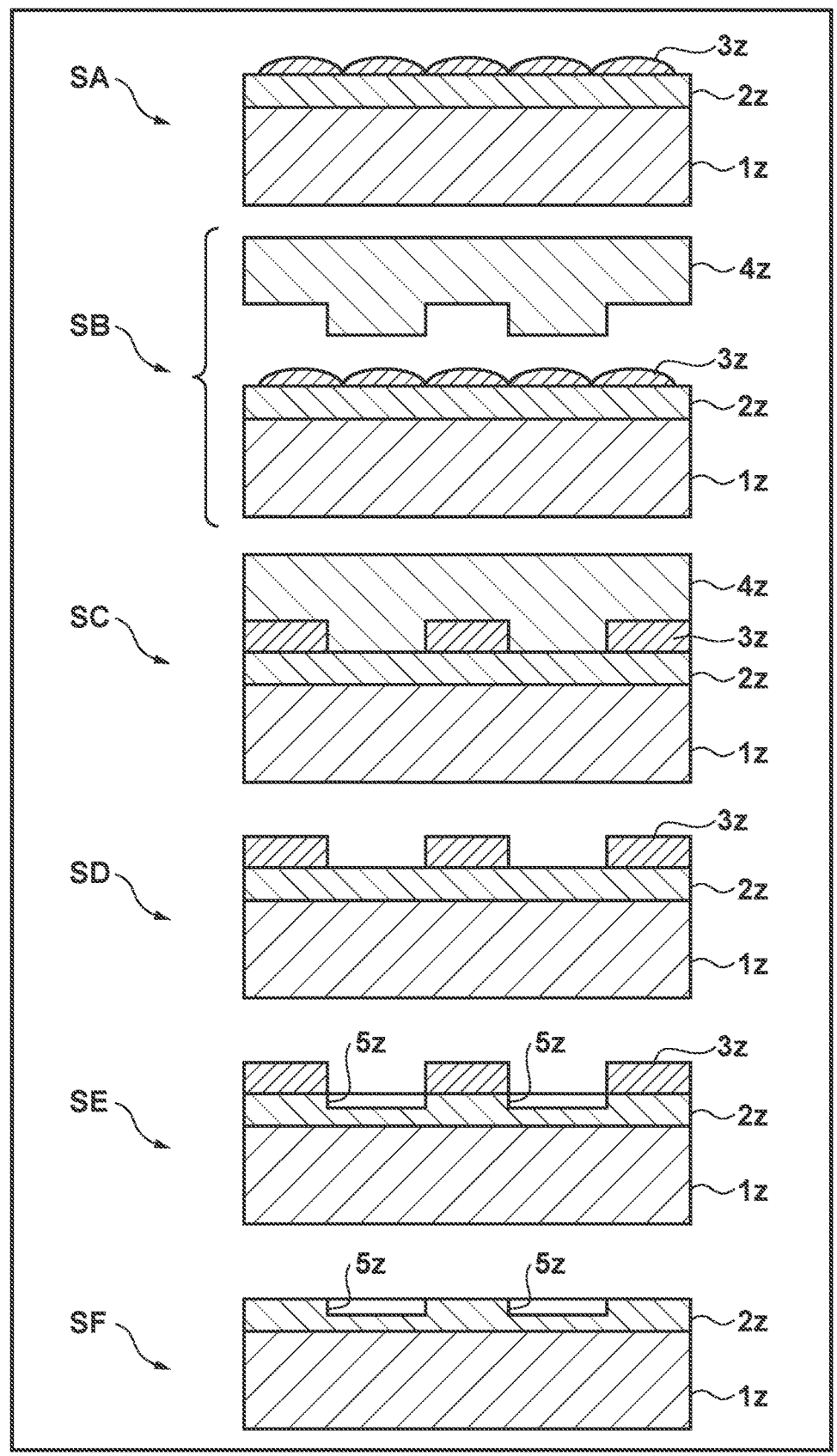
FIG. 14 is a view for explaining an article manufacturing method.

As shown in step SB of FIG. 14, a side of an imprinting mold $4z$ on which its three-dimensional pattern is formed faces the imprint material $3z$ on the substrate. In step SC of FIG. 14, the substrate $1z$ to which the imprint material $3z$ has been applied and the mold $4z$ are brought into contact, and pressure is applied. Gaps between the mold $4z$ and the processing target material $2z$ is filled with the imprint material $3z$. When the imprint material $3z$ is irradiated with light as curing energy through the mold $4z$ in this state, the imprint material $3z$ is cured.

In step SD of FIG. 14, when the mold $4z$ and the substrate $1z$ are separated after the imprint material $3z$ is cured, a pattern of the cured material of the imprint material $3z$ is formed on the substrate $1z$. The pattern of this cured product has a shape such that the concave portion of the mold corresponds to the convex portion of the cured product, and the convex portion of the mold corresponds to the concave portion of the cured product; that is, the three-dimensional pattern of the mold $4z$ is transferred to the imprint material $3z$.

In step SE of FIG. 14, when the pattern of the cured material is etched as an etching resistant mask, portions out of the surface of the processing target material $2z$ where the cured material is not present or thinly remains are removed, and grooves $5z$ are achieved. In step SF of FIG. 14, when the pattern of the cured material is removed, it is possible to achieve an article in which the grooves $5z$ are formed on the surface of the processing target material $2z$. The pattern of the cured product is removed here; however, the pattern of the cured product may be used as, for example, an interlayer dielectric film included in the semiconductor element or the like, that is, the constituent member of the article without removing it after processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-199455, filed Dec. 8, 2021, which is hereby incorporated by reference herein in its entirety.

What is claimed is:

1. An imprint method of performing an imprint process for a shot region of a substrate using a mold, wherein the substrate includes a valid region where a chip is to be formed, and an invalid region outside the valid region where no chip is to be formed, and the invalid region is a region formed by etching an outer region outside the valid region, and the method comprises deciding, based on a height difference between the valid region and the invalid region, an imprint condition for a partial shot region defined by an outer edge of the valid region;

performing the imprint process for the partial shot region in accordance with the decided imprint condition;

acquiring information of a substrate end structure which is a structure of the invalid region of the substrate; and predicting, based on a relationship between an imprint condition and a displacement of the mold in an imprint process, the relationship being obtained in advance, a displacement of the mold in an imprint process performed under a temporarily set imprint condition, wherein in the deciding the imprint condition, the imprint condition is decided by modifying the temporarily set imprint condition based on the height difference obtained from the substrate end structure and the predicted displacement, and wherein the imprint condition includes a plurality of imprint conditions, the method further comprises deciding a priority of modification of each condition based on information of a sensitivity to a relative shot shape between the mold and the substrate and a sensitivity to deformation of the mold with respect to a change in each of the plurality of imprint conditions, and in the deciding the imprint condition, the imprint condition is modified in an order of the priority.

2. The method according to claim 1, wherein in the deciding the priority, a higher priority is given as the sensitivity to the relative shot shape is lower and the sensitivity to deformation of the mold is higher.

3. The method according to claim 1, wherein the plurality of imprint conditions include an imprint force upon bringing the mold into contact with an imprint material on the partial shot region, a back pressure which is a pressure applied to a back surface of the mold, and a tilt of the mold.

4. The method according to claim 1, wherein in the acquiring the information, the information is acquired by measuring the substrate end structure or predicting the substrate end structure based on at least any of a design condition and a processing condition of the substrate.

5. An article manufacturing method comprising:

forming a pattern on a substrate in accordance with an imprint method defined in claim 1; and processing the substrate with the pattern formed thereon, wherein an article is manufactured from the processed substrate.

* * * * *